US012574036B2

(12) United States Patent
Grimaldi et al.

(10) Patent No.: US 12,574,036 B2
(45) Date of Patent: Mar. 10, 2026

(54) QUANTIZATION ERROR AND SPUR MITIGATION IN A DIGITAL PHASE-LOCKED LOOP

(71) Applicant: Infineon Technologies AG, Neubiberg (DE)

(72) Inventors: Luigi Grimaldi, Villach (AT); Dmytro Cherniak, Villach (AT); Fabio Versolatto, Buttrio (IT); Giovanni Boi, Padua (IT); Fabio Padovan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/808,447

(22) Filed: Aug. 19, 2024

(65) Prior Publication Data

US 2026/0051895 A1      Feb. 19, 2026

(51) Int. Cl.
*H03L 7/099*       (2006.01)
*H03M 3/00*       (2006.01)

(52) U.S. Cl.
CPC ............ *H03L 7/099* (2013.01); *H03M 3/328* (2013.01)

(58) Field of Classification Search
None
See application file for complete search history.

(56) References Cited

U.S. PATENT DOCUMENTS

| | | | | |
|---|---|---|---|---|
| 8,344,772 B2 * | 1/2013 | Lee | ......................... | H03L 7/085 |
| | | | | 375/376 |
| 10,516,405 B2 * | 12/2019 | Yu | ......................... | G04F 10/005 |
| 11,184,013 B1 * | 11/2021 | Grimaldi | ................ | H03C 3/095 |
| 12,355,452 B2 * | 7/2025 | Wulff | ....................... | H03L 7/093 |
| 2015/0015343 A1 * | 1/2015 | Ballantyne | ........... | H03B 5/1265 |
| | | | | 331/36 C |
| 2017/0194973 A1 * | 7/2017 | Moehlmann | ............ | H03L 7/093 |
| 2023/0327681 A1 * | 10/2023 | Mazzaro | ............... | H03M 3/354 |
| | | | | 341/77 |

* cited by examiner

*Primary Examiner* — Cassandra F Cox

(74) *Attorney, Agent, or Firm* — Harrity & Harrity, LLP

(57) ABSTRACT

A digital phase-locked loop (DPLL) may include a dithering source to provide a dithering signal that is on an order of up to one integer bit on a set of fractional bits of a modulation signal. The DPLL may include a digitally controlled oscillator (DCO) to generate a DPLL output signal. The DPLL may include a primary delta-sigma modulator (DSM) to drive a primary capacitor bank of the DCO based on the dithering signal and the modulation signal, a first auxiliary DSM to drive a first auxiliary capacitor bank of the DCO based on the dithering signal in association with cancelling an effect of the dithering signal on the DPLL output signal, and a second auxiliary DSM to drive a second auxiliary capacitor bank of the DCO based on the modulation signal and the dithering signal in association with cancelling an effect of a quantization error of the primary DSM.

22 Claims, 4 Drawing Sheets

100

1

QUANTIZATION ERROR AND SPUR MITIGATION IN A DIGITAL PHASE-LOCKED LOOP

BACKGROUND

A phase-locked loop (PLL) is a device that generates a clock and synchronizes the clock with a reference signal. One application of a PLL is frequency synthesis. In a frequency synthesis application, a PLL can be used to generate a clock based on a reference clock (e.g., a reference signal provided by a reference oscillator). Notably, a frequency of the clock generated by the PLL can be a multiple of a frequency of the original clock. A digital PLL (DPLL) is a type of PLL that uses a digital control to synthesize a desired frequency. Components of a DPLL can include a phase detector (e.g., a time-to-digital convertor (TDC)), a digital loop filter (DLF), a delta sigma modulator (DSM), an oscillator, and a divider. In the case of an all-digital PLL (ADPLL), the oscillator is a digitally-controlled oscillator (DCO) (rather than a voltage-controlled oscillator (VCO) as used in a conventional PLL). In operation of a DPLL, the phase detector senses a phase difference between a reference signal and a feedback signal, with the feedback signal being generated by dividing an output signal of DCO. The phase detector converts the phase difference to a phase error signal in the digital domain, and the phase error signal is filtered by the DLF and is then used in association with controlling the DCO.

SUMMARY

In some implementations, a DPLL includes a dithering source to provide a dithering signal, wherein the dithering signal is on an order of up to one integer bit on a set of fractional bits of a modulation signal; a DCO to generate a DPLL output signal based at least in part on the modulation signal, wherein the DCO comprises a primary capacitor bank, a first auxiliary capacitor bank, and a second auxiliary capacitor bank; a primary DSM to drive the primary capacitor bank based on the dithering signal and the modulation signal; a first auxiliary DSM to drive the first auxiliary capacitor bank based on the dithering signal in association with cancelling an effect of the dithering signal on the DPLL output signal; and a second auxiliary DSM to drive the second auxiliary capacitor bank based on the modulation signal and the dithering signal in association with cancelling an effect of a quantization error of the primary DSM on the DPLL output signal.

In some implementations, a DPLL includes a dithering source to provide a dithering signal that causes periodicity to be eliminated from a quantization error of a DSM of the DPLL; a primary signal path comprising the DSM; a first auxiliary signal path comprising a first auxiliary DSM associated with cancelling an effect of the dithering signal on an output signal of the DPLL; and a second auxiliary signal path comprising a second auxiliary DSM associated with cancelling an effect of the quantization error of the primary DSM on the output signal of the DPLL.

In some implementations, a DPLL includes a dithering source to provide a dithering signal, wherein the dithering signal is on an order of up to one integer bit on a set of fractional bits of a modulation signal; a DCO to generate a DPLL output signal based at least in part on the modulation signal; a primary DSM to drive a primary capacitor bank of the DCO based on the dithering signal and the modulation signal; and a second auxiliary DSM to drive a second auxiliary capacitor bank of the DCO based on the modulation signal and the dithering signal in association cancelling an effect of at least a quantization error of the primary DSM on the DPLL output signal.

DETAILED DESCRIPTION

Figure 1A:
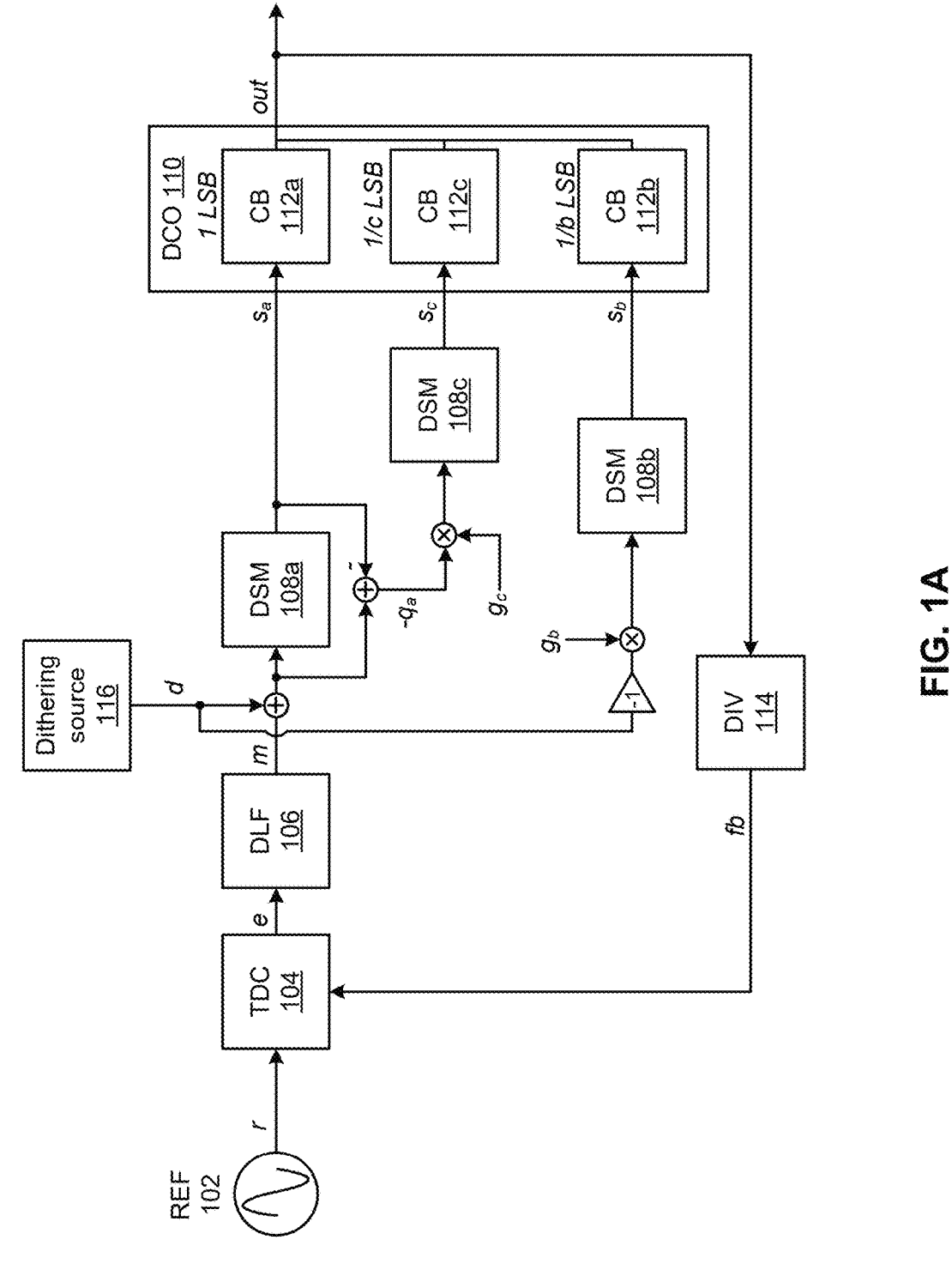
FIGS. 1A-1B are diagrams illustrating example implementations of a DPLL that provides quantization error and spur mitigation, as described herein.

The following detailed description of example implementations refers to the accompanying drawings. The same reference numbers in different drawings may identify the same or similar elements.

A DPLL (e.g., an ADPLL) may need to satisfy a stringent specification in terms of spot phase noise (also referred to as emission mask) in a given application. For example, a DPLL used in a communication application or in a radar application may need to satisfy a stringent specification in terms of spot phase noise. Specifically, a given electromagnetic compatibility (EMC) regulation (e.g., an EMC regulation of the Federal Communications Commission (FCC), an EMC regulation of the European Telecommunications Standards Institute (ETSI), or the like) may pose a limitation on high frequency offsets emissions in terms of both noise and spurs.

Conventionally, a DPLL includes a DSM (between a DLF and a DCO) to increase an equivalent frequency resolution of the DPLL. Notably, while the DSM increases the frequency resolution, the DSM also introduces quantization error. The DSM can be configured to perform high-pass shaping of the quantization error. However, in some scenarios, the contribution of the quantization error introduced by the DSM to phase noise in the output signal of the DPLL can cause a desired emission mask to be violated and, therefore, can cause satisfaction of an applicable EMC emission regulation to be challenging or impossible.

A first technique to address the quantization error introduced by the DSM is to translate a digital signal, provided by the DSM, into an analog signal by means of a digital-to-analog converter (DAC). The output of the DAC is provided to a low-pass filter (LPF) with a cut-off frequency that is set to filter a bump of quantization noise of the DSM so as to reduce an impact of the quantization noise at high offset frequencies. The output of the LPF is then utilized to drive a varactor of a voltage-controlled oscillator (VCO). The cascade of the DAC, the LPF, and the VCO can be considered to be an equivalent DCO with filtering of the DSM quantization noise. However, this technique has a number of disadvantages, including overhead in analog design, increased complexity of layout, and increased power consumption.

A second technique to address the quantization error introduced by the DSM is to include an additional digitally-controlled capacitor bank in the DCO, in parallel with a primary capacitor bank of the DCO. The additional capacitor bank is characterized by a finer frequency gain as compared to the primary capacitor bank (e.g., the frequency gain of the additional capacitor bank may be $\frac{1}{8}^{th}$ of the frequency gain of the primary capacitor bank). The additional capacitor bank can be used to cancel the quantization error of the (primary) DSM that drives the primary capacitor bank. In operation, the quantization error is extracted with an opposite sign, scaled by a gain equal to a ratio between the frequency gains of the primary capacitor bank and the additional capacitor bank (e.g., a gain equal to 8), and fed to an additional DSM. If the quantization error cancellation path is matched, both in amplitude and phase, then the quantization error of the primary DSM is cancelled and the remaining quantization is that of the additional DSM, which in power (phase noise) is lower (e.g., $20 \times \log_{10}(8)=18$ decibels (dB) lower in the case of the frequency gain of the additional capacitor bank being $\frac{1}{8}^{th}$ of that of the primary capacitor bank). Thus, an impact of quantization error on the output of the DPLL is significantly reduced. This solution is advantageous in that it requires analog design of the additional capacitor bank and relatively low complexity digital circuitry to control the additional capacitor bank. However, this technique has a fundamental limitation when a ramp is used as a modulation signal (e.g., in a frequency-modulated continuous wave (FMCW) radar application). As can be seen in FIG. 2A, discussed in further detail below, there is an inherent periodicity inside the extracted quantization error from the primary DSM. Here, because the additional capacitor bank is inherently non-ideal (i.e., does not exhibit perfectly-linear frequency behavior versus control) this periodicity is converted into spurs by means of the non-linearity of the capacitor bank, which can dramatically impair system performance. For example, in an FMCW radar application, the spurs caused by the periodicity of the quantization error can result in false target detection.

Some implementations described herein provide a DPLL that provides mitigation of quantization error and spurs. In some implementations, the DPLL may include a dithering source to provide a dithering signal. The dithering signal may be on an order of up to one integer bit on a set of fractional bits of a modulation signal. The DPLL may further include a DCO to generate a DPLL output signal based at least in part on the modulation signal. The DCO may include a primary capacitor bank, a first auxiliary capacitor bank, and a second auxiliary capacitor bank. The DPLL may further include a primary DSM to drive the primary capacitor bank based on the dithering signal and the modulation signal. The DPLL may further include a first auxiliary DSM to drive the first auxiliary capacitor bank based on the dithering signal in association with cancelling an effect of the dithering signal on the DPLL output signal. The DPLL may further include a second auxiliary DSM to drive the second auxiliary capacitor bank based on the modulation signal and the dithering signal in association with cancelling an effect of a quantization error of the primary DSM on the DPLL output signal.

The DPLL described herein avoids the limitation of the technique described above that uses an additional DSM to cancel the quantization error of the primary DSM. For example, the DPLL described herein may break the periodicity of the quantization error of the primary DSM by means of a strong dithering source in front of the primary DSM. Typically, dithering is a technique applied to prevent spur generation from a DSM (e.g., pattern noise) and a dithering signal is relatively small. Conversely, in the DPLL described herein, the dithering source is strong enough so as to enable scrambling of the generation of the quantization error of the primary DSM, thereby removing any periodicity in the quantization error. Of course, this strong dithering signal is undesirable from the perspective of phase noise, as the dithering signal would jeopardize noise performance. For this reason, the DPLL described herein comprises a signal path that cancels the dithering signal. Additional details are provided below.

Figure 1B:
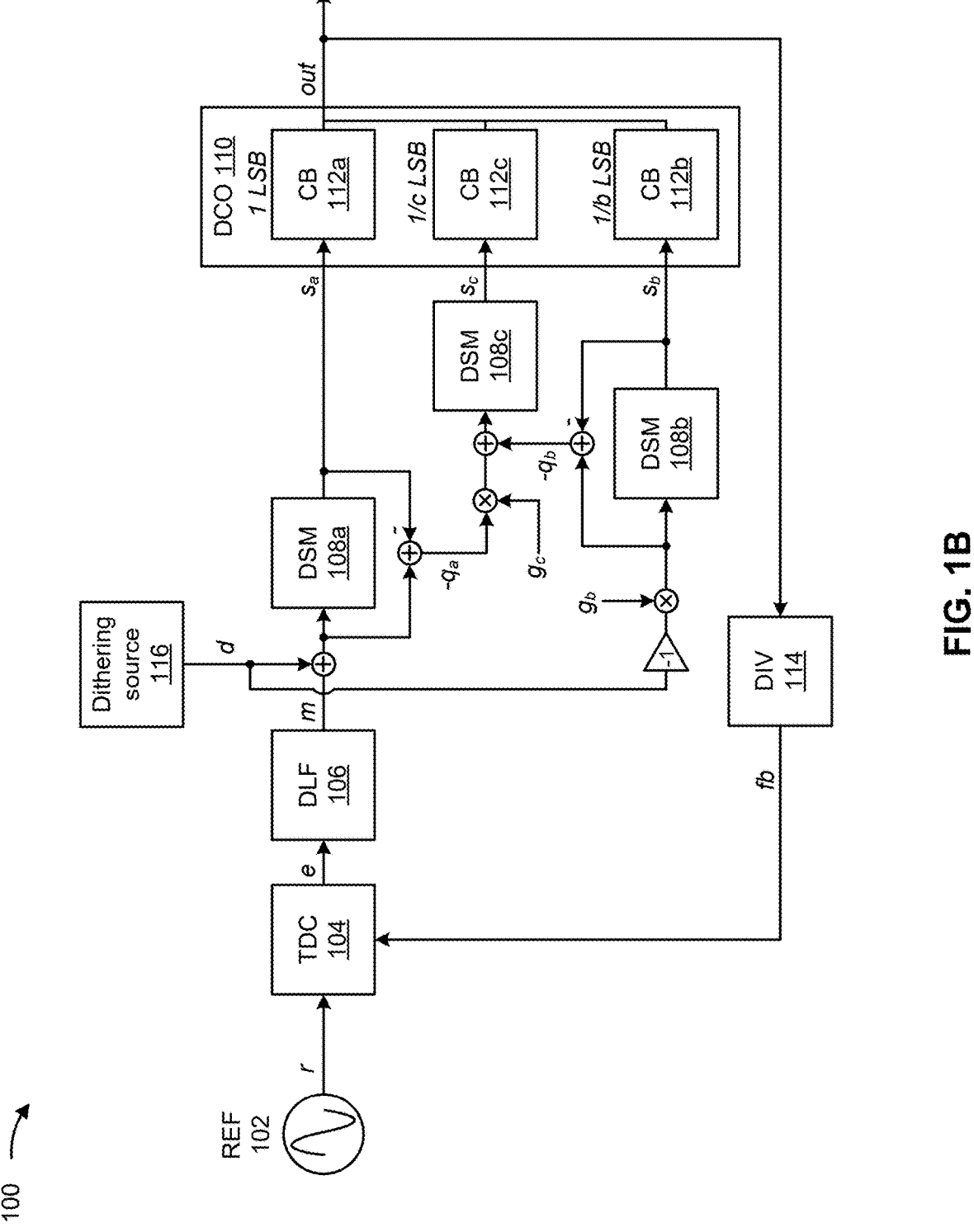

FIGS. 1A-1B are diagrams illustrating example implementations of a DPLL 100 that provides quantization error and spur mitigation. As shown in FIGS. 1A-1B, the DPLL 100 may include a reference oscillator (REF) 102, a TDC 104, a DLF 106, a group of DSMs 108 (e.g., a DSM 108a, a DSM 108b, and a DSM 108c), a DCO 110 comprising a group of capacitor banks 112 (e.g., a capacitor bank 112a, a capacitor bank 112b, and a capacitor bank 112c), a frequency divider 114, and a dithering source 116.

The REF 102 is a component configured to provide a reference signal. That is, the REF 102 is component that provides a reference signal based on which an output signal (identified as out in FIGS. 1A-1B) of the DPLL 100 is to be generated and with which the output signal is to be synchronized. The reference signal is identified as r in FIGS. 1A-1B.

The TDC 104 is a component configured to provide a phase error signal that indicates a phase difference between the reference signal and a feedback signal. That is, the TDC 104 may detect a phase difference between the reference signal and the feedback signal generated by the DPLL 100. The phase error signal and the feedback signal are identified as e and fb, respectively, in FIGS. 1A-1B. As shown, in some implementations, the feedback signal is an output of the DIV 114. Thus, in some implementations, the feedback signal is the frequency-divided output signal output by the DIV 114.

The DLF 106 is a component configured to control the DSM 108 or the DCO 110 based on the phase error signal provided by the TDC 104. That is, the DLF 106 may be configured to receive the phase error signal and adjust control of the DSM 108 or the DCO 110 based on the phase error signal (e.g., in order to improve synchronization between the reference signal and the output signal of the DPLL 100). In some implementations, an output of the DLF 106 is a modulation signal. The modulation signal is identified as m in FIGS. 1A-1B.

The DSM 108a (also referred to as the primary DSM 108a) is a component configured to increase an equivalent frequency resolution of the DPLL 100. In some implementations, the primary DSM 108a may be configured to drive the primary capacitor bank 112a based on the dithering signal and the modulation signal. In some implementations, as illustrated in FIGS. 1A-1B, an input signal of the primary DSM 108a is a signal that results from summing a dithering signal provided by the dithering source and the modulation signal provided by the DLF 106.

The DSM 108b (also referred to as the first auxiliary DSM 108b) is a component configured to drive the first auxiliary capacitor bank 112b based on the dithering signal. In some implementations, the first auxiliary DSM 108b drives the first auxiliary capacitor bank 112b in association with cancelling an effect of the dithering signal on the output signal of the DPLL 100, as described below. In some implementations, an input signal of the first auxiliary DSM 108b is a signal that results from inverting and scaling (e.g., by a gain $g_b$) the dithering signal provided by the dithering source 116.

The DSM 108c (also referred to as the second auxiliary DSM 108c) is a component configured to drive the second auxiliary capacitor bank 112c based on the modulation signal and the dithering signal. In some implementations, the second auxiliary DSM 108c drives the second auxiliary capacitor bank 112c in association with cancelling an effect of a quantization error of the primary DSM 108a on the output signal of the DPLL 100, as described below. In some implementations, as shown in FIG. 1A, an input signal of the second auxiliary DSM 108c is a signal that results from scaling (e.g., by a gain $g_c$) a difference signal associated with the primary DSM 108a. The difference signal associated with the primary DSM 108a is identified as $-q_a$ in FIGS. 1A-1B. Here, the difference signal associated with the primary DSM 108a corresponds to a quantization error of the primary DSM 108a. That is, in some implementations, the input signal of the second auxiliary DSM 108c is a difference between the input of the primary DSM 108a and an output of the primary DSM 108a, scaled by $g_c$.

Additionally, in some implementations, the second auxiliary DSM 108c may drive the second auxiliary capacitor bank 112c in association with cancelling an effect of a quantization error of the first auxiliary DSM 108b on the output signal of the DPLL 100, as described below. In some such implementations, as shown in FIG. 1B, an input signal of the second auxiliary DSM 108c is a signal that results from summing the scaled difference signal associated with the primary DSM 108a (e.g., the signal $-q_a$ scaled by the gain $g_c$) and a scaled difference signal associated with first auxiliary DSM 108b. The scaled difference signal associated with the first auxiliary DSM 108b is identified as $-q_b$ in FIG. 1B. Here, the scaled difference signal associated with the first auxiliary DSM 108b corresponds to a quantization error of the first auxiliary DSM 108b. Thus, in some implementations, the input signal of the second auxiliary DSM 108c is a difference between the input of the primary DSM 108a and an output of the primary DSM 108a, scaled by $g_c$, plus a difference between an input of the first auxiliary DSM 108b and an output of the first auxiliary DSM 108b.

In some implementations, the gain $g_b$ applied to the dithering signal (e.g., the gain applied on a signal path of the first auxiliary DSM 108b) may be different from the gain $g_c$ applied to the difference signal associated with the primary DSM 108a (e.g., the gain applied on a signal path of the second auxiliary DSM 108c). Alternatively, in some implementations, the gain $g_b$ applied to the dithering signal may be the same as the gain $g_c$ applied to the difference signal associated with the primary DSM 108a. In some implementations, the gain $g_b$ applied to a to the dithering signal is based on a gain factor of the first auxiliary capacitor bank 112b. Similarly, the gain $g_c$ applied to the difference signal associated with the primary DSM 108a may in some implementations be based on a gain factor of the second auxiliary capacitor bank 112c.

The DCO 110 is a component configured to generate the output signal of the DPLL 100. In some implementations, the DCO 110 includes the capacitor bank 112a (also referred to as the primary capacitor bank 112a), the capacitor bank 112b (referred to as the first auxiliary capacitor bank 112), and the capacitor bank 112c (referred to as the second auxiliary capacitor bank 112). In some implementations, the DCO 110 generates the output signal of the DPLL 100 based on outputs of the primary capacitor bank 112a, the first auxiliary capacitor bank 112b, and the second auxiliary capacitor bank 112c. In some implementations, a frequency or other characteristic of the output signal generated by the DCO 110 is controlled by the DLF 106, as described above. In some implementations, as shown in FIGS. 1A-1B, the DCO 110 may be configured to provide the output signal to the DIV 114 (in addition to providing the output signal as an output of the DPLL 100). In some implementations, the first auxiliary capacitor bank 112b has a first gain factor (identified as 1/b in FIGS. 1A-1B) and the second auxiliary cap bank 112c has a second gain factor (identified as 1/c in FIGS.

1A-1B). In some implementations, the first gain factor is different from the second gain factor. Alternatively, the first gain factor of the first auxiliary capacitor bank 112b may be the same as the second gain factor of the second auxiliary capacitor bank 112c. In one example, the gain factor of the first auxiliary capacitor bank 112 and the gain factor of the second auxiliary capacitor bank 112c may be equal to ⅛ (e.g., 1/b=1/c=⅛), such that the frequency gains of the first auxiliary capacitor bank 112b and the second auxiliary capacitor bank 112c are scaled by a factor of ⅛ as compared to the 1 least significant bit (LSB) gain of the primary capacitor bank 112a.

The DIV 114 is a component configured to perform frequency division on the output signal of the DPLL 100 to generate the frequency-divided output signal. In some implementations, the frequency-divided output signal is a signal that has a frequency that matches the frequency of the reference signal and a phase that matches the phase of the output signal. In some implementations, the DIV 114 provides the feedback signal to the TDC 104.

The dithering source 116 is a component configured to provide a dithering signal. In some implementations, the dithering signal is a signal that is used to scramble generation of the quantization error of the primary DSM 108a so as to remove periodicity from the quantization error of the primary DSM 108a. In some implementations, the dithering signal is a strong dithering signal. For example, the dithering signal may be on an order of up to one integer bit of the modulation signal (e.g., nearly an entire fractional portion of an integer bit, such as ±0.9999). In some implementations, the dithering signal is a zero mean signal (e.g., to prevent the dithering signal from corrupting the output signal of the DPLL 100). In some implementations, the dithering signal is a random signal, meaning that the values of the dithering signal are randomly generated. The effect of this randomization is to scramble the quantization error of the primary DSM 108a as noted above.

In an example operation of the DPLL 100 shown in FIG. 1A, on a primary signal path, the dithering signal d provided by the dithering source 116 is summed with the modulation signal m provided by the DLF 106, a result which provided as an input to the primary DSM 108a. An output of the primary DSM 108a, identified as $s_a$ in FIG. 1A, drives the primary capacitor bank 112a of the DCO 110. On a first auxiliary signal path, the dithering signal d is inverted and scaled by gain $g_b$, a result of which is provided as an input to the first auxiliary DSM 108b. An output of the first auxiliary DSM 108b, identified as sb in FIG. 1A, drives the first auxiliary capacitor bank 112b of the DCO 110. On a second auxiliary signal path, the input of the primary DSM 108a (i.e., a result of summing the dithering signal d and the modulation signal m) and the output of the primary DSM 108a are used to generate a difference signal $-q_a$, which corresponds to the quantization error of the primary DSM 108a. The difference signal $-q_a$ is scaled by gain $g_c$, and a resulting signal is provided as an input to the second auxiliary DSM 108c. An output of the second auxiliary DSM 108c, identified as $s_c$ in FIG. 1A, drives the second auxiliary capacitor bank 112c of the DCO. The DCO 110 generates the output signal out based on outputs of the primary capacitor bank 112a, the first auxiliary capacitor bank 112b, and the second auxiliary capacitor bank 112c. In this example, the first auxiliary capacitor bank 112b serves to cancel an effect of the dithering signal d on the output signal out of the DPLL 100, and the second auxiliary capacitor bank 112c serves to cancel an effect of the quantization error of the primary DSM 108a on the output signal out of the DPLL 100.

In an example operation of the DPLL 100 shown in FIG. 1B, on a primary signal path, the dithering signal d provided by the dithering source 116 is summed with the modulation signal m provided by the DLF 106, a result which provided as an input to the primary DSM 108*a*. An output of the primary DSM 108*a*, identified as $s_a$ in FIG. 1B, drives the primary capacitor bank 112*a* of the DCO 110. On a first auxiliary signal path, the dithering signal d is inverted and scaled by gain $g_b$, a result of which is provided as an input to the first auxiliary DSM 108*b*. An output of the first auxiliary DSM 108*b*, identified as sb in FIG. 1B, drives the first auxiliary capacitor bank 112*b* of the DCO 110. On a second auxiliary signal path, the input of the primary DSM 108*a* (i.e., a result of summing the dithering signal d and the modulation signal m) and the output of the primary DSM 108*a* are used to generate a difference signal $-q_a$, which corresponds to the quantization error of the primary DSM 108*a*. The difference signal $-q_a$ is scaled by gain $g_c$. Further, the input of the first auxiliary DSM 108*b* (i.e., a result of inverting and scaling the dithering signal d by gain $g_b$) and the output of the first auxiliary DSM 108*b* are used to generate a difference signal $-q_b$, which corresponds to the quantization error of the first auxiliary DSM 108*b*. The scaled difference signal $-q_a$ is summed with the difference signal $-q_b$, a result of which is provided as an input to the second auxiliary DSM 108*c*. An output of the second auxiliary DSM 108*c*, identified as $s_c$ in FIG. 1B, drives the second auxiliary capacitor bank 112*c* of the DCO. The DCO 110 generates the output signal out based on outputs of the primary capacitor bank 112*a*, the first auxiliary capacitor bank 112*b*, and the second auxiliary capacitor bank 112*c*. In this example, the first auxiliary capacitor bank 112*b* serves to cancel an effect of the dithering signal d on the output signal out of the DPLL 100, and the second auxiliary capacitor bank 112*c* serves to cancel an effect of the quantization error of the primary DSM 108*a* and an effect of the quantization error of the first auxiliary DSM 108*b* on the output signal out of the DPLL 100.

In this way, the DPLL 100 may serve to break the periodicity of the quantization error of the primary DSM 108*a* by means of the dithering signal d that is sufficiently strong so as to scramble the generation of the quantization error of the primary DSM 108*a*, thereby removing periodicity in the quantization error of the DSM 108*a*. Further, the DPLL 100 cancels an effect of the dithering signal d such that the dithering signal d does not impact an output signal of the DPLL 100. As a result, the primary DSM 108*a* can perform high-pass shaping as intended, while reducing or eliminating an impact of the quantization error introduced by the primary DSM 108*a* to phase noise in the output signal of the DPLL 100, thereby preventing an emission mask from being violated and enabling satisfaction of an applicable EMC emission regulation.

As indicated above, FIGS. 1A-1B are provided as examples. Other examples may differ from what is described with regard to FIGS. 1A-1B. The number and arrangement of components shown in FIGS. 1A-1B are provided as an example. In practice, there may be additional components, fewer components, different components, or differently arranged components than those shown in FIGS. 1A-1B. Furthermore, two or more components shown in FIGS. 1A-1B may be implemented within a single component, or a single component shown in FIGS. 1A-1B may be implemented as multiple, distributed components. Additionally, or alternatively, a set of components (e.g., one or more components) shown in FIGS. 1A-1B may perform one or more functions described as being performed by another set of components shown in FIGS. 1A-1B.

Figure 2B:
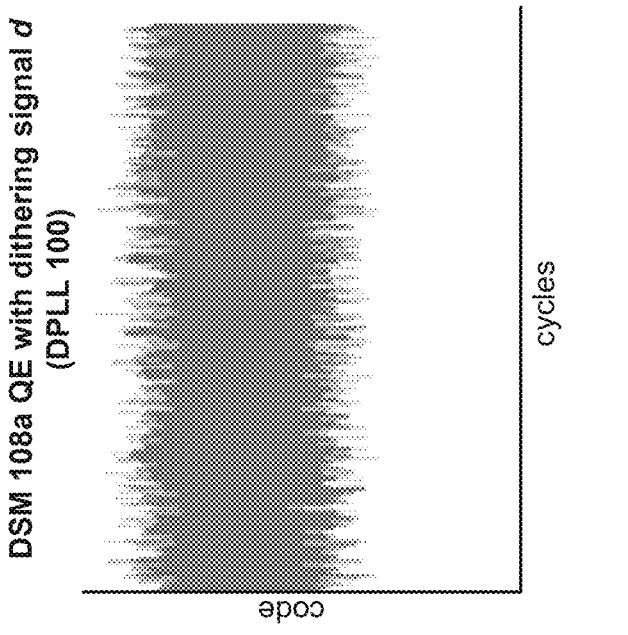
FIGS. 2A-2B are diagrams illustrating an impact on a quantization error of a primary DSM provided by the use of a strong dithering signal, as described herein.
Figure 2A:
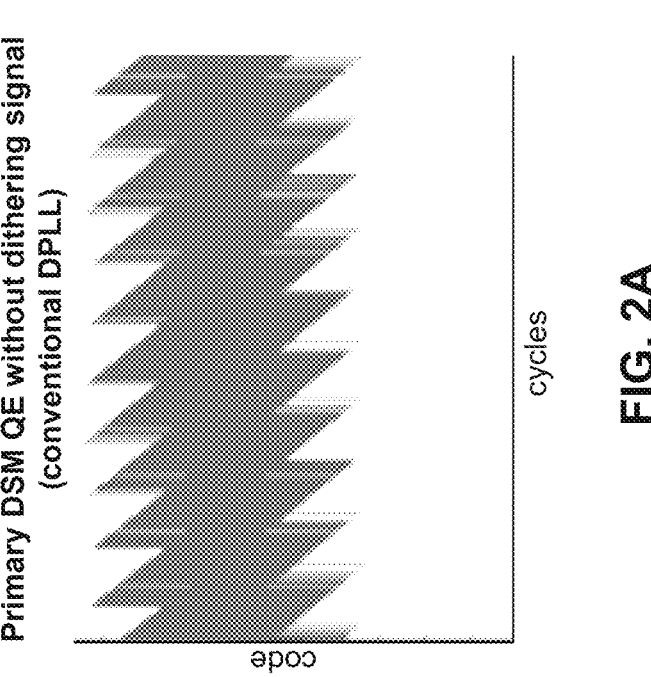

FIGS. 2A-2B are diagrams illustrating an impact on the quantization error of the primary DSM 108*a* provided by the use of the strong dithering signal d. FIG. 2A illustrates an example of a quantization error of a primary DSM in a DPLL that provides quantization error cancellation using an additional DSM in a conventional manner (i.e., without using a strong dithering signal as described herein). FIG. 2B illustrates an example of a quantization error of the primary DSM 108*a* in the DPLL 100 described herein. As can be seen in FIG. 2A, the quantization error of the primary DSM in the conventional DPLL has a periodic pattern. Comparatively, as can be seen in FIG. 2B, periodicity has been removed from the quantization error of the primary DSM 108*a* due to the use of the strong dithering signal.

As indicated above, FIGS. 2A-2B are provided as examples. Other examples may differ from what is described with regard to FIGS. 2A-2B.

Figure 3:
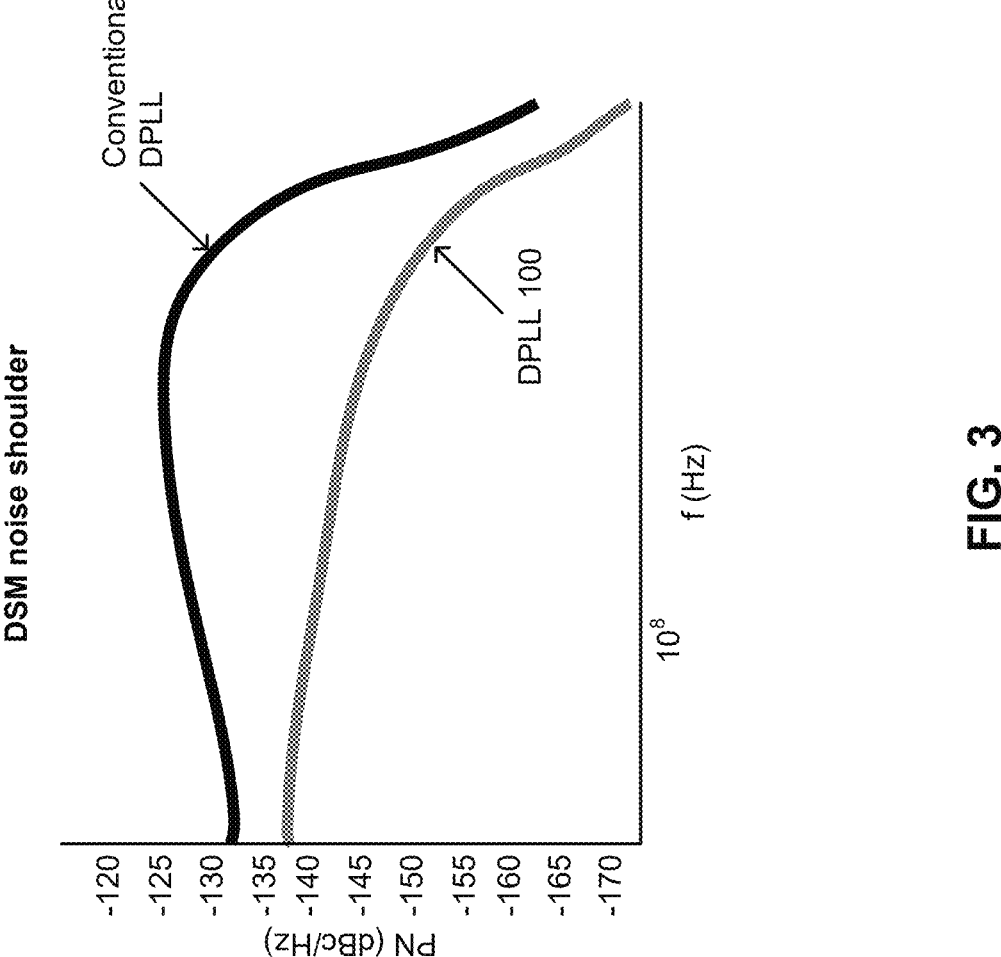
FIG. 3 is a diagram illustrating an impact on a noise shoulder of a primary DSM provided by the techniques and apparatuses described herein.

FIG. 3 is a diagram illustrating an impact on a noise shoulder of the primary DSM 108*a* provided by the techniques and apparatuses described herein. The dark curve in FIG. 3 represents phase noise in an output of a conventional DPLL, while the lighter gray curve in FIG. 3 represents phase noise in an output of the DPLL 100 (e.g., in terms of decibels referenced to a carrier in a hertz bandwidth (dBc/Hz) over frequency (f)). In some scenarios, the phase noise in the DPLL 100 as illustrated in FIG. 3 may be sufficiently low such that an emission mask is not violated in a given frequency range and, therefore, can enable satisfaction of an applicable EMC emission regulation.

As indicated above, FIG. 3 is provided as an example. Other examples may differ from what is described with regard to FIG. 3.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

When "a component" or "one or more components" (or another element, such as "a controller" or "one or more controllers") is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X; perform Y; and perform Z," that claim should be interpreted to mean "one or more components configured to perform X; one or more (possibly different) components configured to perform Y; and one or more (also possibly different) components configured to perform Z."

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A digital phase-locked loop (DPLL), comprising:
a dithering source to provide a dithering signal, wherein the dithering signal is on an order of up to one integer bit on a set of fractional bits of a modulation signal;
a digitally controlled oscillator (DCO) to generate a DPLL output signal based at least in part on the modulation signal, wherein the DCO comprises a primary capacitor bank, a first auxiliary capacitor bank, and a second auxiliary capacitor bank;
a primary delta-sigma modulator (DSM) to drive the primary capacitor bank based on the dithering signal and the modulation signal;

a first auxiliary DSM to drive the first auxiliary capacitor bank based on the dithering signal in association with cancelling an effect of the dithering signal on the DPLL output signal; and
a second auxiliary DSM to drive the second auxiliary capacitor bank based on the modulation signal and the dithering signal in association with cancelling an effect of a quantization error of the primary DSM on the DPLL output signal.

2. The DPLL of claim 1, wherein the second auxiliary DSM is to drive the second auxiliary capacitor bank in association with cancelling an effect of a quantization error of the first auxiliary DSM on the DPLL output signal.

3. The DPLL of claim 1, wherein the dithering signal is to scramble generation of the quantization error of the primary DSM so as to remove periodicity from the quantization error of the primary DSM.

4. The DPLL of claim 1, wherein the dithering signal is a zero mean signal.

5. The DPLL of claim 1, wherein an input signal of the primary DSM is a signal that results from summing the dithering signal and the modulation signal.

6. The DPLL of claim 1, wherein an input signal of the first auxiliary DSM is a signal that results from inverting and scaling the dithering signal.

7. The DPLL of claim 1, wherein an input signal of the second auxiliary DSM is a signal that results from summing a scaled difference signal associated with the primary DSM and a scaled difference signal associated with the first auxiliary DSM.

8. The DPLL of claim 1, wherein the first auxiliary capacitor bank has a first gain factor and the second auxiliary capacitor bank has a second gain factor.

9. The DPLL of claim 1, wherein a first gain is applied on a signal path of the first auxiliary DSM and a second gain is applied on a signal path of the second auxiliary DSM.

10. A digital phase-locked loop (DPLL), comprising:
a dithering source to provide a dithering signal that causes periodicity to be eliminated from a quantization error of a primary delta-sigma modulator (DSM) of the DPLL;
a primary signal path comprising the primary DSM;
a first auxiliary signal path comprising a first auxiliary DSM associated with cancelling an effect of the dithering signal on an output signal of the DPLL; and
a second auxiliary signal path comprising a second auxiliary DSM associated with cancelling an effect of the quantization error of the primary DSM on the output signal of the DPLL.

11. The DPLL of claim 10, wherein the second auxiliary DSM is associated with cancelling an effect of a quantization error of the first auxiliary DSM on the output signal of the DPLL.

12. The DPLL of claim 10, wherein the dithering signal is on an order of up to one integer bit on a set of fractional bits of a modulation signal.

13. The DPLL of claim 10, wherein the dithering signal is to scramble generation of the quantization error of the primary DSM.

14. The DPLL of claim 10, wherein the dithering signal is a zero mean signal.

15. The DPLL of claim 10, wherein an input signal of the primary DSM is a signal that results from summing the dithering signal and a modulation signal.

16. The DPLL of claim 10, wherein an input signal of the first auxiliary DSM is a signal that results from inverting and scaling the dithering signal.

17. The DPLL of claim 10, wherein an input signal of the second auxiliary DSM is a signal that results from summing a scaled difference signal associated with the primary DSM and a scaled difference signal associated with the first auxiliary DSM.

18. The DPLL of claim 10, wherein a first gain is applied on a signal path of the first auxiliary DSM and a second gain is applied on a signal path of the second auxiliary DSM, the second gain being different from the first gain.

19. The DPLL of claim 10, further comprising a digitally controlled oscillator (DCO) comprising a primary capacitor bank on the primary signal path, a first auxiliary capacitor bank on the first auxiliary signal path, and a second auxiliary capacitor bank on the second auxiliary signal path.

20. A digital phase-locked loop (DPLL), comprising:

a dithering source to provide a dithering signal, wherein the dithering signal is on an order of up to one integer bit on a set of fractional bits of a modulation signal;

a digitally controlled oscillator (DCO) to generate a DPLL output signal based at least in part on the modulation signal;

a primary delta-sigma modulator (DSM) to drive a primary capacitor bank of the DCO based on the dithering signal and the modulation signal; and a second auxiliary DSM to drive a second auxiliary capacitor bank of the DCO based on the modulation signal and the dithering signal in association cancelling an effect of at least a quantization error of the primary DSM on the DPLL output signal.

21. The DPLL of claim 20, further comprising a first auxiliary DSM to drive a first auxiliary capacitor bank of the DCO based on the dithering signal in association cancelling an effect of the dithering signal on the DPLL output signal.

22. The DPLL of claim 21, wherein the second auxiliary DSM is to drive the second auxiliary capacitor bank in association with cancelling an effect of a quantization error of the first auxiliary DSM on the DPLL output signal.

* * * * *